United States Patent [19]
Mizutani et al.

[11] Patent Number: 5,801,835
[45] Date of Patent: *Sep. 1, 1998

[54] SURFACE POSITION DETECTION APPARATUS AND METHOD

[75] Inventors: Hideo Mizutani; Naoyuki Kobayashi, both of Yokohama; Nobutaka Magome, Kawasaki, all of Japan

[73] Assignee: Nikon Corporation, Tokyo, Japan

[*] Notice: The term of this patent shall not extend beyond the expiration date of Pat. No. 5,587,794.

[21] Appl. No.: 940,818

[22] Filed: Sep. 30, 1997

Related U.S. Application Data

[60] Continuation of Ser. No. 723,512, Sep. 30, 1996, abandoned, which is a division of Ser. No. 239,847, May 9, 1994, Pat. No. 5,587,794, which is a continuation of Ser. No. 802,197, Dec. 4, 1991, abandoned.

[30] Foreign Application Priority Data

Dec. 13, 1990 [JP] Japan .................... 2-401880

[51] Int. Cl.$^6$ .................................. G01B 11/14
[52] U.S. Cl. ................ 356/375; 356/400; 250/548
[58] Field of Search ...................... 356/375, 376, 356/399, 400, 401; 250/548, 557, 561

[56] References Cited

U.S. PATENT DOCUMENTS

| | | | |
|---|---|---|---|
| 4,558,949 | 12/1985 | Uehara et al. | 356/375 |
| 4,595,294 | 6/1986 | Ohki et al. | 356/375 |
| 4,823,014 | 4/1989 | Miyawaki | 356/375 |
| 4,902,900 | 2/1990 | Kamiya et al. | 356/400 |
| 5,124,562 | 6/1992 | Kawashima et al. | 356/375 |
| 5,162,642 | 11/1992 | Akamatsu et al. | 356/376 |
| 5,218,415 | 6/1993 | Kawashima | 356/375 |

FOREIGN PATENT DOCUMENTS 56-42205  4/1981  Japan .

*Primary Examiner*—Hoa Q Pham
*Attorney, Agent, or Firm*—Shapiro and Shapiro

[57] ABSTRACT

In an apparatus and method for surface position detection, a position of a detection surface is determined by illuminating the detection surface with detection light, receiving detection light from the detection surface, designating different parts of the detection surface in accordance with a structure within an illuminated area on the detection surface, and detecting, based on information of the received light and information of the designated parts of the detection surface, positions corresponding to the designated parts of the detection surface.

19 Claims, 11 Drawing Sheets

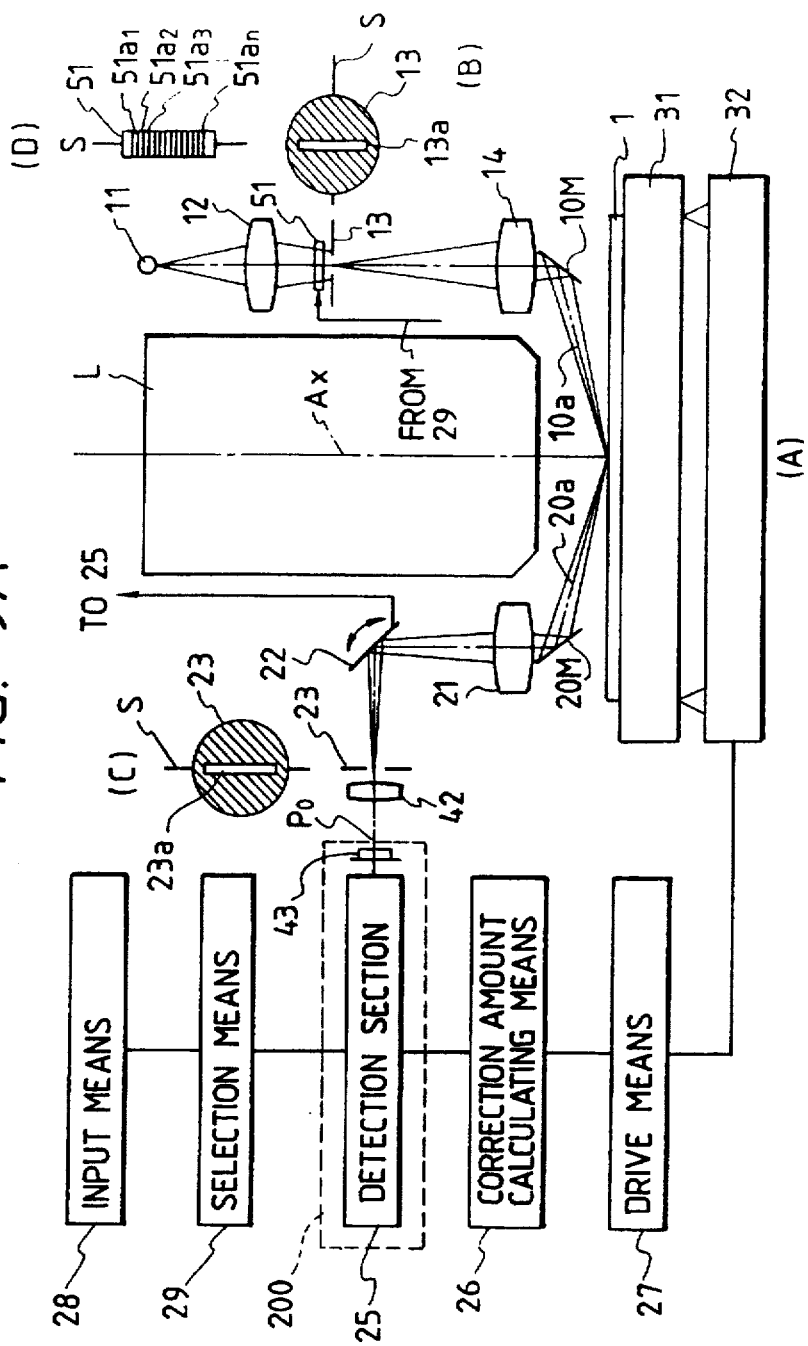
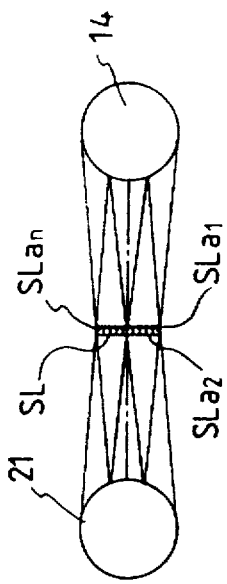
FIG. 9A
FIG. 9B

SURFACE POSITION DETECTION APPARATUS AND METHOD

This is a continuation of application Ser. No. 08/723,512 filed Sep. 30, 1996 (abandoned), which is a division of application Ser. No. 08/239,847 filed May 9, 1994, now U.S. Pat. No. 5,587,194 which is a continuation of application Ser. No. 07/802,197 filed Dec. 4, 1991 (abandoned).

BACKGROUND OF THE INVENTION

1. Field of the Invention

The present invention relates to a surface position detection apparatus and, more particularly, to a focal point position detection apparatus suitable for, e.g., a semiconductor manufacturing apparatus.

2. Related Background Art

As a conventional focal point position detection apparatus in a semiconductor detection apparatus, as disclosed in Japanese Laid-Open Patent Application No. 56-42205 proposed by the assignee as the present application, an oblique incidence type focal point position detection apparatus is used. This apparatus obliquely projects detection light onto a semiconductor wafer arranged at a position where a mask pattern is transferred by a projection lens.

The focal point position detection apparatus uses the surface of a semiconductor wafer as a surface to be detected (to be referred to as a detection surface hereinafter), and projects a slit-like pattern onto the detection surface in a direction wherein the longitudinal direction of a slit becomes perpendicular to a plane defined between incident light and reflected light, i.e., a plane of incidence. The apparatus re-focuses the reflected light on a detection means comprising a photoelectric transducer, thereby detecting an incident position of the reflected light on the detection means.

When the surface as the detection surface of the semiconductor wafer is displaced in the vertical direction (i.e., it approaches or is separated along the optical axis direction of the projection lens), slit reflected light incident on the detection means is image-shifted in a direction parallel to the plane of incidence, i.e., in the widthwise direction of the slit in correspondence with the vertical displacement. By utilizing this effect, the apparatus detects an image shift amount, thereby detecting the vertical position of the surface of the semiconductor wafer. In this manner, it is discriminated whether or not the wafer surface coincides with a focusing reference position of the projection lens, i.e., a conjugate plane with a lens projected by the projection lens.

In this case, the apparatus re-focuses light reflected by a small slit-like pattern region projected on the detection surface, and detects an average position on the small slit-like detection region.

In recent years, along with the increase in degree of integration of LSIs (Large Scale Integrations), demand has arisen for transferring a micropattern onto an exposure region (shot region) on a wafer. In order to meet this demand, a numerical aperture NA of the projection lens is increased. Thus, since the focal depth of a projection objective lens becomes shallow, it is important to accurately and reliably align the exposure region at the focal point position (within the focal depth) of the projection objective lens.

The area of the exposure region by a projection/exposure apparatus is also increasing. Thus, an LSI chip having an increased exposure area is exposed in a single exposure operation, or a plurality of LSI chips are exposed in a single exposure operation. For this reason, it is important to accurately and reliably align the overall exposure region with an increased area with the focal point position (within the focal depth) of the projection objective lens.

Furthermore, when a plurality of LSI chips are exposed at the same time, and when the size of an LSI chip to be exposed (the size of the exposure region) is to be changed, illumination light for position detection cannot be radiated on a proper position on the detection surface, and the position of the projection light must be changed.

In order to solve this problem by the conventional focal point position detection apparatus in this situation, position detection on the exposure region on the wafer must be performed at a plurality of positions.

For this reason, a stage, which places a wafer thereon, may be properly moved so as to project slit light from the focal point position detection apparatus onto necessary detection positions and to detect these positions. However, in this case, a decrease in throughput is inevitable.

SUMMARY OF THE INVENTION

It is, therefore, an object of the present invention to provide a high-performance surface position detection apparatus, which can accommodate a larger exposure region, and can also accommodate a case wherein a plurality of LSI chips are simultaneously exposed or a case wherein the size of an LSI chip to be exposed is changed, without decreasing the throughput in either case.

In order to achieve the above object, according to one aspect of the present invention, a surface position detection apparatus includes: a projection optical system for projecting pattern light of a predetermined pattern on a detection surface from an oblique direction relative to the detection surface; an imaging optical system for forming an image of the pattern light reflected by the detection surface; light-receiving-side light-shielding means arranged at a position substantially conjugate with the detection surface in the imaging optical system, and having an opening with a predetermined shape; scanning means for scanning the image formed by the imaging optical system relative to the light-receiving-side light-shielding means; and means for dividing the pattern light into a plurality of portions corresponding to different parts of the pattern, and for selectively detecting at least one such portion of the pattern light passing through the aforementioned opening.

According to another aspect of the present invention, a surface position detection apparatus includes: a first projection optical system for projecting first pattern light of a first predetermined pattern from an oblique direction onto a detection surface in a first orientation relative to the detection surface; a second projection optical system for projecting second pattern light of a second predetermined pattern from an oblique direction onto the detection surface in a second orientation relative to of the detection surface; a first imaging optical system for forming an image of the first pattern light from the first projection optical system reflected by the detection surface; a second imaging optical system for forming an image of the second pattern light from the second projection optical system reflected by the detection surface; first light-receiving-side light-shielding means arranged at a position substantially conjugate with the detection surface in the first imaging optical system, and having a first opening with a predetermined shape; second light-receiving-side light-shielding means arranged at a position substantially conjugate with the detection surface in the second imaging optical system, and having a second opening with a predetermined shape; first scanning means for scanning the image formed by the first imaging optical system relative to the first light-receiving-side light-shielding means; second scanning means for scanning the image formed by the second imaging optical system relative to the second light-receiving-side light-shielding means; first means for dividing the first pattern light into a plurality of portions corresponding to different parts of the first pattern, and for selectively detecting at least one such portion of the first pattern light passing through the first opening; and second means for dividing the second pattern light into a plurality of portions corresponding to different parts of the second pattern, and for selectively detecting at least one such portion of the second pattern light passing through the second opening.

According to still another aspect of the present invention, a surface position detection apparatus includes: a projection optical system for projecting pattern light of a predetermined pattern through a projection objective lens from an oblique direction onto a detection surface, and including light shaping means at a position substantially conjugate with the detection surface for shaping light to conform with the predetermined pattern; an imaging optical system for forming an image of the pattern light reflected by the detection surface through an imaging objective lens; light-receiving-side light-shielding means arranged at a position substantially conjugate with the detection surface in the imaging optical system, and having an opening with a predetermined shape; scanning means for scanning the image formed by the imaging optical system relative to the light-receiving-side light-shielding means; means for dividing the pattern light into a plurality of portions corresponding to different parts of the pattern, and for selectively detecting at least one such portion of the pattern light passing through the opening; a first beam splitter arranged between the light shaping means and the projection objective lens; a second beam splitter arranged between the imaging objective lens and the light-receiving-side light-shielding means; light source means for supplying a parallel light beam onto the detection surface through the first beam splitter and the projection objective lens; and detection means for detecting an average state of the detection surface on the basis of the parallel light beam reflected from the detection surface, which beam is focused through the imaging objective lens and the second beam splitter.

According to the present invention, since a plurality of pieces of position information of the detection surface on a region where the predetermined pattern light is projected can be obtained, positions of the detection surface can be detected with high accuracy without decreasing the throughput. Thus, an inclination state of the detection surface, a defocus state of the detection surface with respect to the focal point position of a projection lens, and the sectional shape of the detection surface can be accurately detected while accommodating an exposure region with an increased area, simultaneous exposure of LSI chips, and a change in LSI chip size (size of the exposure region).

When a plurality of light components including a plurality of position information on the detection surface are selectively detected, only proper positions on the detection surface can be detected, and the influence of a pattern structure formed on the detection surface can be eliminated. Furthermore, when a plurality of detection signals including a plurality of position information on the detection surface are multiplied with weighting coefficients, a remarkably improved effect can be obtained.

Other objects, features, and effects of the present invention will be sufficiently apparent from the following detailed description taken in conjunction with the accompanying drawings.

BRIEF DESCRIPTION OF THE DRAWINGS

FIGS. 9A and 9B are views showing an arrangement of a surface position detection apparatus according to the third embodiment of the present invention;

DETAILED DESCRIPTION OF THE PREFERRED EMBODIMENTS

The preferred embodiments of the present invention will be described hereinafter with reference to the accompanying drawings.

Figure 1A:
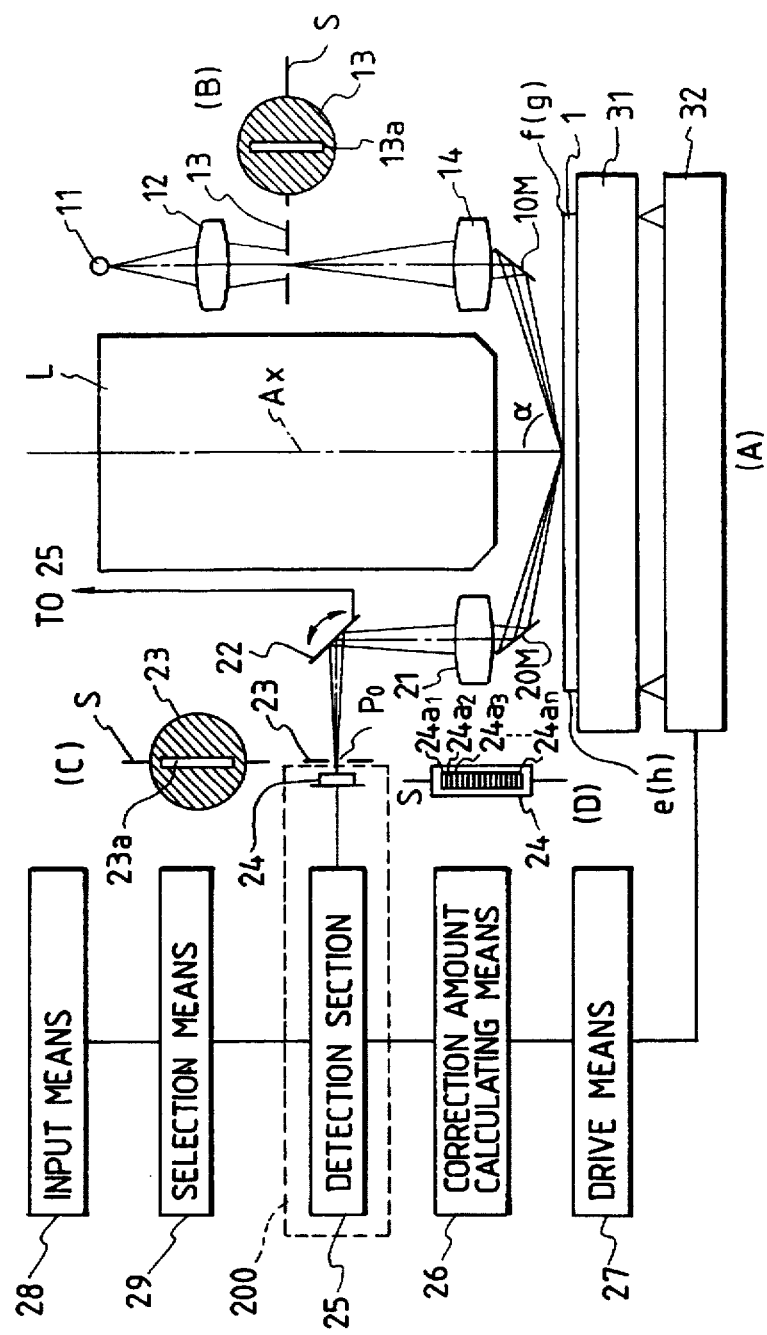
FIGS. 1A and 1B are views showing an arrangement of a surface position detection apparatus according to the first embodiment of the present invention.
Figure 1B:
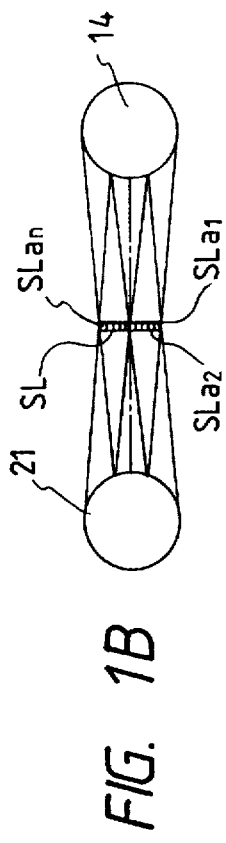

FIG. 1A shows a schematic arrangement according to the first embodiment of the present invention. (A) of FIG. 1A is a schematic side view showing an optical path in an incident plane, and FIG. 1B is a schematic plan view showing an optical path when a detection surface 1 is viewed from a position immediately thereabove.

Illumination light from a light source 11 illuminates a projection slit plate 13 as projection-side light-shielding means through a condenser lens 12.

As shown in a plan view of (B) of FIG. 1A, the slit plate 13 has a linear pattern, and is arranged to be perpendicular to the optical axis, so that the longitudinal direction of this pattern extends in a direction perpendicular to the drawing surface of (A) of FIG. 1A. Light passing through the slit plate 13 is focused on the detection surface 1, which crosses an optical axis Ax of a projection lens L at a predetermined angle of incidence α, by a projection objective lens 14 and a reflection mirror 10M. More specifically, an image SL of the slit plate 13 is projected onto the detection surface 1 by projection objective lens 14, and the longitudinal direction of the slit image is perpendicular to the drawing surface of (A) of FIG. 1A. FIG. 1B illustrates the detection surface 1 at that time when viewed from a position immediately thereabove.

Light reflected by the detection surface 1 is reflected by a reflection mirror 20M, and is focused by an imaging objective lens 21. The light is then reflected by a vibration mirror 22 as scanning means, which scans in a direction indicated by an arrow in FIG. 1A. Thereafter, the light is focused on a light-receiving slit plate 23 as light-receiving-side light-shielding means. More specifically, the slit image SL formed on the detection surface is re-focused on the light-receiving slit 23 by the focusing objective lens 21.

The light-receiving slit plate 23 has a linear pattern like in the projection slit plate 13, as shown in (C) of FIG. 1A, and its longitudinal direction is perpendicular to a plane of incidence S, i.e., is perpendicular to the drawing surface of (A) of FIG. 1A. Light passing through the light-receiving slit 23 is detected by a photoelectric transducer 24.

As shown in (D) of FIG. 1A, the photoelectric transducer 24 has a plurality of independent light-receiving portions ($24a_1$, $24a_2$, $24a_3$, . . . , $24a_n$), which are linearly arranged in a direction parallel to the plane of incidence S (in a direction perpendicular to the drawing surface of (A) of FIG. 1A).

Figure 2B:
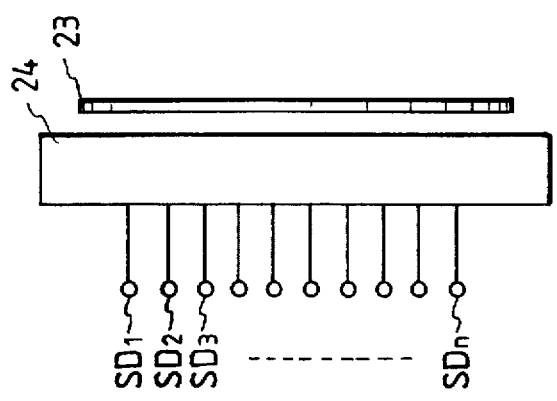
FIGS. 2A and 2B are views showing a state of a photo-electric transducer arranged adjacent to a light-receiving slit plate in the first embodiment of the present invention.
Figure 2A:
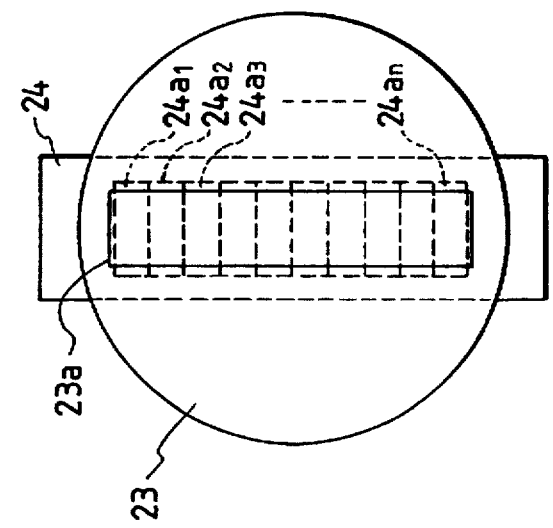

FIG. 2A is a plan view showing a state of the light-receiving slit plate 23, and the photoelectric transducer 24 arranged adjacent to the plate 23, and FIG. 2B is a side view corresponding to FIG. 2A.

The light-receiving portions $24a_1$, $24a_2$, $24a_3$, . . . , $24a_n$ of the photoelectric transducer 24 can independently detect light components reflected by portions $SLa_1$, $SLa_2$, $SLa_3$, . . . , $SLa_n$ of the linear pattern image SL projected on a linear detection region conjugate with these portions, as shown in FIG. 1B.

The components between the light source 11 and the projection objective lens 14 constitute a projection optical system, and components between the imaging objective lens and the light-receiving slit plate 23 constitute an imaging optical system. The photoelectric transducer 24 and a detection section 25 constitute a detection means 200.

The principle of detecting the displacement of the detection surface 1 will be described in detail below with reference to FIG. 3. Note that the same reference numerals in FIG. 3 denote members having the same functions as those in FIG. 1A. In place of the vibration mirror 22 shown in FIG. 1A, the light-receiving slit 23 is vibrated in a plane (a direction) perpendicular to the optical axis.

For the sake of simplicity, the number of light-receiving surfaces of the photoelectric transducer 24 is assumed to be one. Assuming that the detection surface 1 is displaced downward from a reference position $Z_0$ by a distance $\Delta Z$, while maintaining a horizontal state, as shown in FIG. 3, a displacement $\Delta y$ of a slit image on the light-receiving slit plate 23 is given by:

$$\Delta y = 2 \cdot \beta \cdot \sin \alpha \cdot \Delta Z$$

where β is the focusing magnification of the light-receiving-side objective lens 21, and α is the angle of incidence defined between slit detection light and the normal to the detection surface 1 (the complement of the angle defined between the optical axis of the projection objective lens and the detection surface 1). The displacement $\Delta Z$ of the detection surface 1 can be detected based on the position shift amount $\Delta y$ of the slit image on the light-receiving slit plate 23, which amount is obtained from the photoelectric transducer 24 according to the above-mentioned relation.

Figure 3:
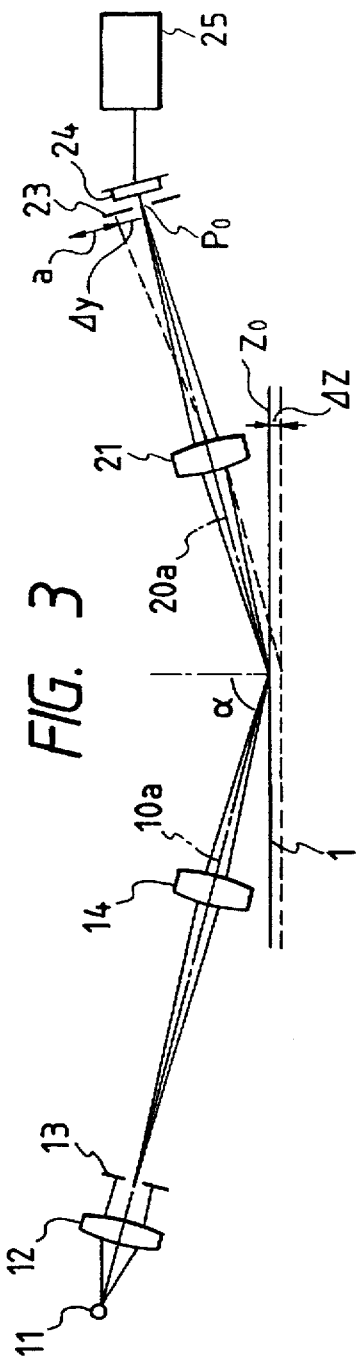
FIG. 3 is a view showing the principle of position detection in the surface position detection apparatus of the present invention.

In this case, the optical system is formed, so that when the entire detection surface 1 is at the level of the reference position $Z_0$ (in the horizontal state at the reference position $Z_0$), light reflected by the detection surface 1 and propagating along an optical axis 20a of the imaging optical system is incident at a reference position $P_0$ of the light-receiving slit plate 23 (FIG. 3). Note that the projection optical system has an optical axis 10a, and the imaging optical system has the optical axis 20a. When the light reflected by the detection surface 1 and propagating along the optical axis 20a of the imaging optical system is incident at the reference position $P_0$ of the light-receiving slit plate 23, and when the slit image SL is vibrated at a period T to have the reference position $P_0$ as the center, the intensity of modulated light, which reaches the light-receiving surface of the photoelectric transducer 24, is changed to almost a sine wave shape having a period T/2. Thus, a sine wave detection output can be obtained from the photoelectric transducer 24. When the detection output is synchronously detected by the detection section 25, if the reflected light reaching the light-receiving surface of the photoelectric transducer 24 is shifted by $\Delta Z$ in a direction perpendicular to its direction of incidence, a detection output corresponding to the position shift amount can be obtained.

A method of detecting a displacement by a synchronous detection technique is disclosed in, e.g., Japanese Laid-Open Patent Application No. 56-42205, and is the principle of a photoelectric microscope.

Figure 4:
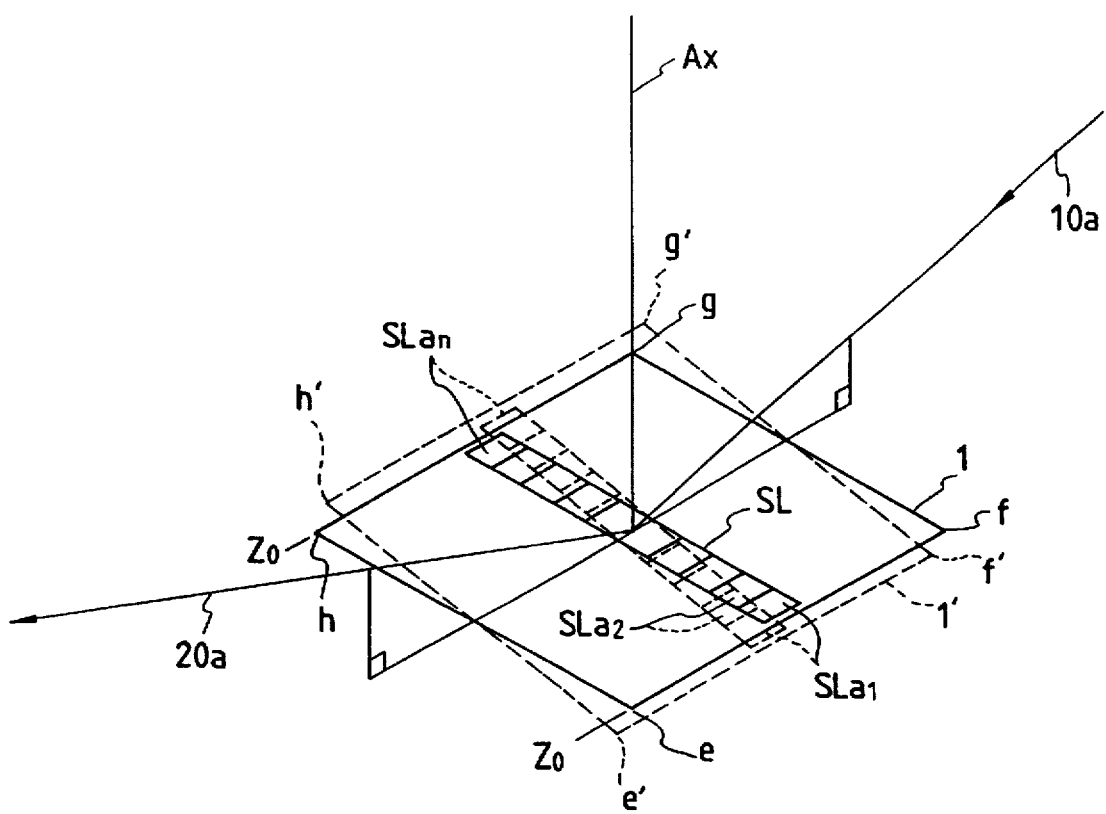
FIG. 4 is a perspective view showing a state wherein a detection surface in FIGS. 1A and 1B is inclined.

In the above description of the detection method, a case has been explained wherein the photoelectric transducer 24 is assumed to have one light-receiving surface. According to the first embodiment of the present invention, as shown in FIG. 1A, the light-receiving surface of the photoelectric transducer 24 has the individual light-receiving portions $24a_1$, $24a_2$, $24a_3$, . . . , $24a_n$ along the longitudinal direction of the light-receiving slit plate 23. For this reason, as shown in FIG. 1B, the portions $SLa_1$, $SLa_2$, $SLa_3$, . . . , $SLa_n$ of the slit image SL reflected by the corresponding portions of the detection surface 1 are received by the corresponding light-receiving portions $24a_1$, $24a_2$, $24a_3$, . . . , $24a_n$ of the photoelectric transducer 24, thus obtaining the detection outputs $SD_1$, $SD_2$, $SD_3$, . . . , $SD_n$. These detection outputs are synchronously detected by the detection section 25, thereby independently detecting a plurality of positions corresponding to the positions of the portions $SLa_1$, $SLa_2$, $SLa_3$, . . . , $SLa_n$ of the projection slit image SL. Since the plurality of positions of the projection slit image SL on the detection surface 1 can be detected, not only focal points at the plurality of positions but also an inclination state of the detection surface 1 can be detected, as can be seen from FIG. 4, which shows an inclined state of the detection surface shown in FIG. 1. Furthermore, the sectional shape of the detection surface can also be detected.

Detection of a state wherein the detection surface 1 is defocused from the reference position $Z_0$, a state wherein the detection surface 1 is inclined with respect to the reference position $Z_0$, and a state wherein the detection surface 1 is defocused and inclined with respect to the reference position $Z_0$ will be described in detail below with reference to FIGS. 5A to 5C (showing the principle of projection optical system when viewed from the optical axis $20a$ of the detection optical system shown in FIG. 1A) and FIGS. 6A to 6C (showing slit images formed on the light-receiving slit plate 23 shown in FIG. 1A).

Figure 5A:
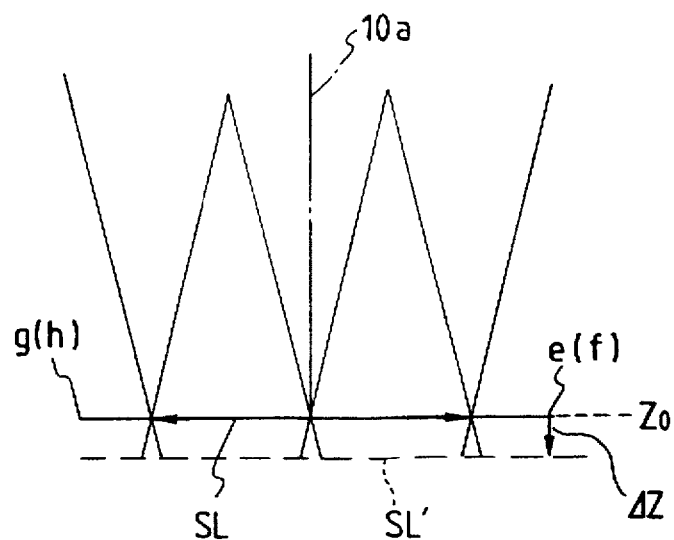
FIGS. 5A to 5C are views showing states of the detection surface when a projection optical system is viewed from the sheet surface direction of FIG. 1A.
Figure 6A:
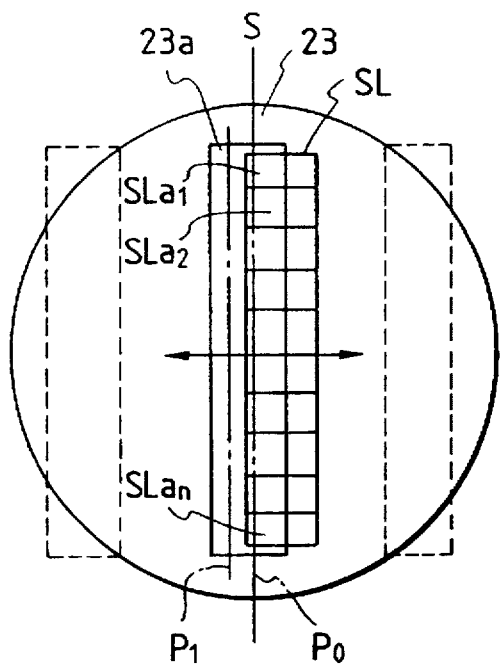
FIGS. 6A to 6C are plan views showing states of slit images focused on a light-receiving slit according to the states of the detection surface shown in FIGS. 5A to 5C.
Figure 6C:
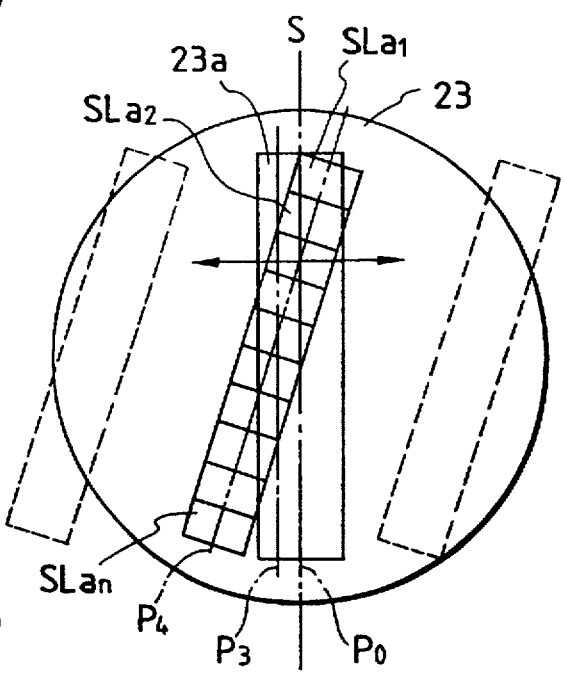
Figure 6B:
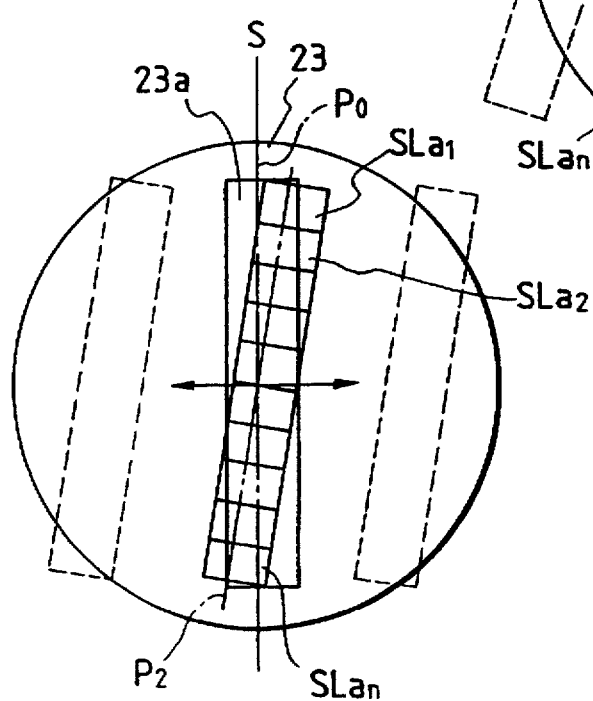

When the detection surface 1 is simply defocused from the reference position $Z_0$, as shown in FIG. 5A, the center of vibration of the slit image SL crossing the light-receiving slit plate 23 is parallelly moved from $P_0$ to $P_1$ due to the vibration of the vibration mirror 22 shown in FIG. 1A in the direction of the arrow, as shown in FIG. 6A. Upon reception of the corresponding portions of the slit image SL by the light-receiving portions $24a_1, 24a_2, 24a_3, \ldots, 24a_n$ of the photoelectric transducer 24, a plurality of detection outputs (optical modulation outputs) $SD_1, SD_2, SD_3, \ldots, SD_n$, which are equal to each other, are obtained. When these detection outputs are synchronously detected by the detection section 25, the defocus amounts $\Delta Z$ of the corresponding portions of the detection surface 1 from the reference position $Z_0$ can be independently detected.

Figure 5B:
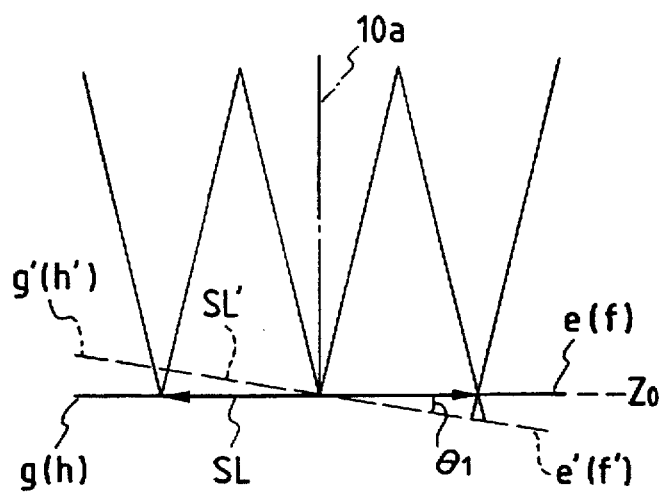

When the detection surface 1 is simply inclined with respect to the reference position $Z_0$, as shown in FIG. 5B, the center of vibration of the slit image SL crossing the light-receiving slit plate 23 is inclined from $P_0$ to $P_2$ according to an inclination $\theta_1$ of the detection surface 1 due to the vibration of the vibration mirror 22 shown in FIG. 1A in the direction of the arrow. Upon reception of the corresponding portions $SLa_1, SLa_2, SLa_3, \ldots, SLa_n$ of the slit image SL on the detection surface 1 by the light-receiving portions $24a_1, 24a_2, 24a_3, \ldots, 24a_n$ of the photoelectric transducer 24, a plurality of detection outputs (optical modulation outputs) $SD_1, SD_2, SD_3 \ldots, SD_n$, which are different from each other according to the positions (inclinations) at the portions $SLa_1, SLa_2, SLa_3, \ldots, SLa_n$ of the slit image SL, can be obtained. When these detection outputs are synchronously detected by the detection section 25, the inclination $\theta_1$ of the detection surface 1 with respect to the reference position $Z_0$ can be finally detected.

Figure 5C:
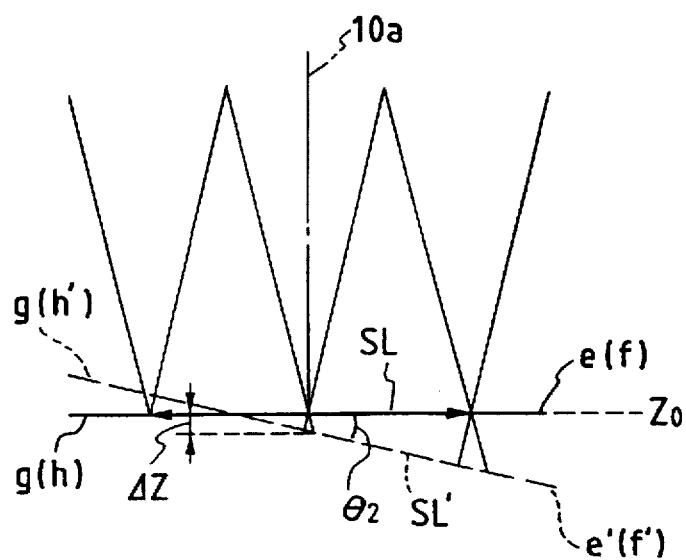

When the detection surface 1 is defocused by $\Delta Z$ and is inclined by $\theta_2$ with respect to the reference position $Z_0$, as shown in FIG. 5C, the center of vibration of the slit image SL crossing the light-receiving slit plate 23 is parallelly moved from $P_0$ to $P_3$ by the defocus amount $\Delta Z$ with respect to the reference position $Z_0$, and is inclined from $P_3$ to $P_4$ according to the inclination $\theta_2$ of the detection surface 1 due to the vibration of the vibration mirror 22 shown in FIG. 1A in the direction of the arrow. Upon reception of the corresponding portions $SLa_1, SLa_2, SLa_3, \ldots, SLa_n$ of the slit image SL by the light-receiving portions $24a_1, 24a_2, 24a_3, \ldots, 24a_n$ of the photoelectric transducer 24, a plurality of detection outputs (optical modulation outputs) $SD_1, SD_2, SD_3, \ldots, SD_n$, which are different from each other according to the positions (defocus amounts and inclinations) at the portions $SLa_1, SLa_2, SLa_3, \ldots, SLa_n$ of the slit image SL, can be obtained. When these detection outputs are synchronously detected by the detection section 25, the defocus amount $\Delta Z$ and the inclination $\theta_2$ of the detection surface 1 with respect to the reference position $Z_0$ can be finally detected.

As described above, according to the present invention, since the positions of a plurality of points on the detection surface can be measured at the same time, the defocus amount and the inclination of the detection surface can be sufficiently quickly detected, and the position of the detection surface can be detected with higher accuracy.

In order to correct the surface state of the detection surface 1 obtained by measuring the positions of a plurality of points on the detection surface 1 in this manner to the reference position (reference plane) $Z_0$, a correction amount calculating means 26 calculates a correction amount on the basis of the detection signals corresponding to the positions of the detection surface 1 detected by the detection section 25, and a drive means 27 moves a correction apparatus 32 on the basis of the correction signal. For example, the correction apparatus 32 moves an XY stage 31, which has a wafer as the detection surface 1 placed thereon, in a direction of an optical axis an AX of the projection lens L, or moves it to correct the inclination of the surface of an exposure region.

In the above description, the detection method of a detection surface according to the present invention has been exemplifed. When an exposure region of a semiconductor manufacturing apparatus is a detection surface, the following problems are posed depending on pattern structures formed on the detection surface.

(A) When patterns having different reflectances, e.g., patterns of an Al (aluminum) layer and a non-Al layer, are patterned on a wafer, the detected light amount considerably changes due to a large difference between the reflectances of the Al and non-Al layers.

(B) When both coarse and dense patterns are patterned on a wafer, the dense pattern requires stricter position detection accuracy than that of the coarse pattern.

(C) When a stepped structure including high and low portions is present on a wafer, the height of the detection surface varies depending on detection positions due to the stepped structure, and position detection results include errors.

(D) When the above-mentioned pattern structures (A) to (C) are present at the same time, the detected light amount changes due to patterns having different reflectances, the coarse and dense patterns require different position detection accuracy levels, and the height of the detection surface varies depending on detection positions due to the stepped structure.

Therefore, in order to solve the above-mentioned problems due to the pattern structures, and to cope with a deficient chip (a chip present on a peripheral portion of a wafer, on which a pattern of an exposure region can only be partially transferred), as shown in FIG. 1A, it is preferable to arrange an input means 28 for inputting a map of a pattern based on a design value, which pattern is formed on the detection surface, and a selection means 29 for selecting an optimal one of the portions ($SLa_1, SLa_2, SLa_3, \ldots, SLa_n$) of the projection slit image SL projected on the detection surface 1 on the basis of output information (output signal) from the input means 28.

(A) When the projection slit image SL is located on the detection surface 1 on which layers having different reflectances are patterned, the selection means 29 preferably selects a position to be detected by one of the following methods (A1) to (A3).

(A1) The selection means 29 instructs the detection section 25 to detect only a portion having a high or low reflectance on the detection surface where the projection slit image SL is located.

(A2) The selection means 29 instructs the detection section 25 to independently detect portions having high and low reflectances on the detection surface where the projection slit image SL is located, and to detect an average value of these pieces of detected information.

(A3) The selection means 29 instructs the detection section 25 to independently detect portions having high and low reflectances on the detection surface where the projection slit image SL is located, to weight pieces of independently detected information, and to detect an average value of these pieces of detected information.

(B) When the projection slit image SL is located on the detection surface where coarse and dense patterns are patterned, the selection means 29 preferably selects a detection position by one of the following methods (B1) and (B2).

(B1) The selection means 29 instructs the detection section 25 to detect only a coarse or dense pattern portion on the detection surface where the projection slit image SL is located.

(B2) The selection means 29 instructs the detection section 25 to independently detect coarse and dense pattern portions on the detection surface where the projection slit image SL is located, to weight pieces of independently detected information, and to detect an average value of these pieces of detected information.

(C) When a stepped structure is formed on the detection surface, the selection means 29 preferably selects a position to be detected by one of the following methods (C1) to (C3).

(C1) The selection means 29 instructs the detection section 25 to detect only a high or low portion of the stepped structure on the detection surface where the projection slit image SL is located.

(C2) The selection means 29 instructs the detection section 25 to independently detect high and low portions of the stepped structure on the detection surface where the projection slit image SL is located, and to detect an average value of these pieces of detected information.

(C3) The selection means 29 instructs the detection section 25 to independently detect high and low portions of the stepped structure on the detection surface where the projection slit image SL is located, to weight two pieces of detected information, and to detect an average value of these pieces of detected information.

(D) When the projection slit image SL is located on a region where the above-mentioned pattern structures (A) to (C) are present on the stepped structure of the detection surface, the selection means 29 preferably selects a position to be detected by one of the following methods (D1) to (D6).

(D1) The selection means 29 instructs the detection section 25 to detect only a high portion having a high (or low) reflectance of the stepped structure, or a low portion having a low (or high) reflectance of the stepped structure on the detection surface where the projection slit image SL is located.

(D2) The selection means 29 instructs the detection section 25 to independently detect a high portion having a high (or low) reflectance of the stepped structure, and a low portion having a high (or low) reflectance of the stepped structure on the detection surface where the projection slit image SL is located, to weight these pieces of detected information, and to detect an average value of these pieces of detected information.

(D3) The selection means 29 instructs the detection section 25 to independently detect a high portion having a high reflectance of the stepped structure, and a low portion having a high reflectance of the stepped structure on the detection surface where the projection slit image SL is located so as to obtain first information by weighting pieces of detected information, to independently detect a high portion having a low reflectance of the stepped structure, and a low portion having a low reflectance of the stepped structure on the detection surface where the projection slit image SL is located so as to obtain second information by weighting pieces of detected information, and to detect an average value of the first information and the second information.

(D4) The selection means 29 instructs the detection section 25 to detect only a high portion having a dense (or coarse) pattern of the stepped structure, or a low portion having a dense (or coarse) pattern of the stepped structure on the detection surface where the projection slit image SL is located.

(D5) The selection means 29 instructs the detection section 25 to independently detect a high portion having a dense (or coarse) pattern of the stepped structure, and a low portion having a dense (or coarse) pattern of the stepped structure on the detection surface where the projection slit image SL is located, to weight these pieces of detected information, and to detect an average value of these pieces of detected information.

(D6) The selection means 29 instructs the detection section 25 to independently detect a high portion having a dense pattern of the stepped structure, and a low portion having a dense pattern of the stepped structure on the detection surface where the projection slit image SL is located so as to obtain first information by weighting pieces of detected information, to independently detect a high portion having a coarse pattern of the stepped structure, and a low portion having a coarse pattern of the stepped structure on the detection surface where the projection slit image SL is located so as to obtain second information by weighting pieces of detected information, and to detect an average value of the first information and the second information.

A deficient chip, where only a portion of an exposure region is present, may often be present on a peripheral portion of a wafer as the detection surface 1. In this case, the selection means 29 may instruct the detection section 25 to detect a position of only a necessary portion to be exposed.

The above description exemplifies some examples of methods to be selected by the selection means 29 according to the pattern structures on the detection surface. However, the present invention is not limited to these methods. For example, on the actual detection surface 1, a pattern structure having different reflectances, a pattern structure including both coarse and dense patterns, a stepped pattern structure, and the like are arbitrarily present. In this case, it is preferable that the selection means 29 properly selects the light-receiving portions ($24a_1$, $24a_2$, $24a_3$, . . . , $24a_n$) at a plurality of proper positions on the photoelectric transducer 24, and instructs the detection section 25 to weight and detect the position signals at the selected positions. In this manner, an optimal average surface can be detected in the direction of thickness of the detection surface without being influenced by the pattern structures at all.

In order to increase a position detection speed, it is preferable that the selection means 29 properly selects only pieces of position information of the detection surface corresponding to proper positions. Alternatively, the light-receiving portions ($24a_1$, $24a_2$, $24a_3$, . . . , $24a_n$) on the photoelectric transducer 24 may be simultaneously detected in units of n portions.

Furthermore, the arrangement of the selection means 29 may be omitted. In this case, information (data), which designates only a plurality of proper positions in consideration of the above-mentioned pattern structures on a wafer as the detection surface, is input in advance to the input means 28, and the detection section 25 may detect a plurality of predetermined positions on the detection surface on the basis of an instruction from the input means 28.

Figures 7A, 7B:
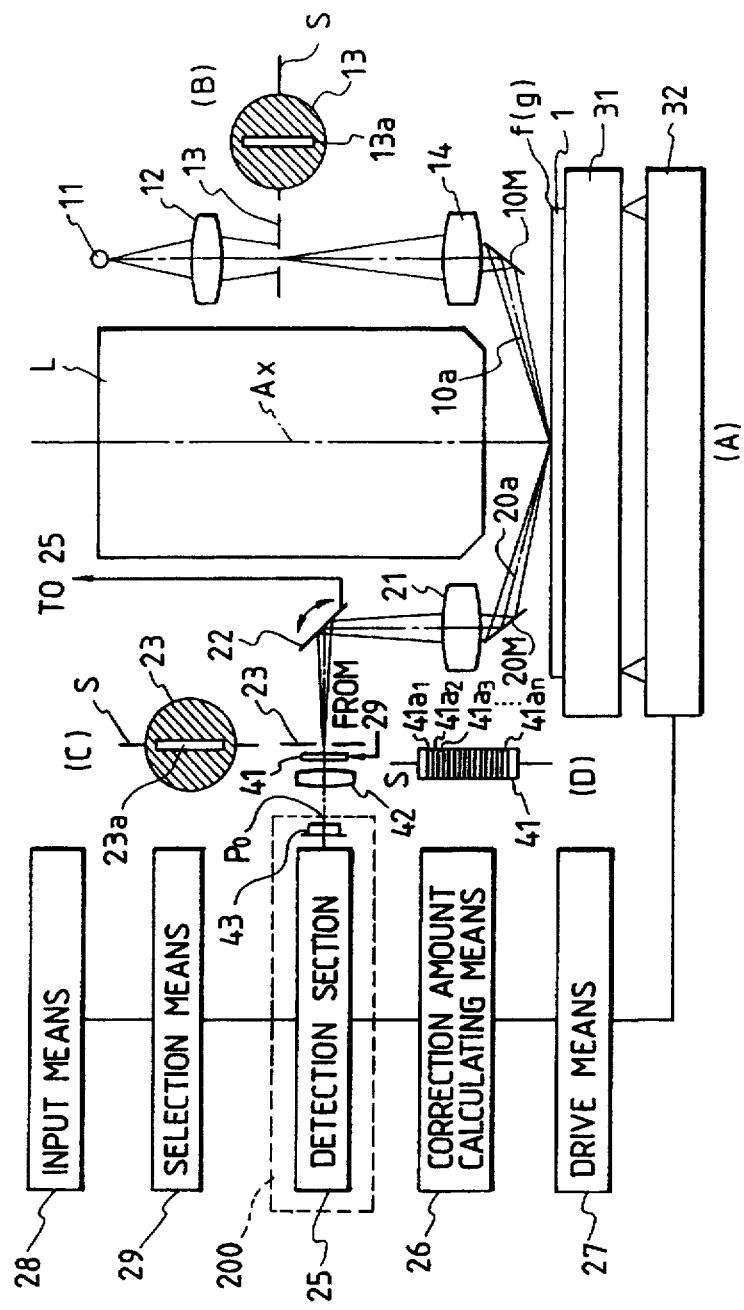
FIGS. 7A and 7B are views showing an arrangement of a surface position detection apparatus according to the second embodiment of the present invention.

The second embodiment of the present invention will be described below. FIGS. 7A and 7B show the schematic arrangement of the second embodiment. The same reference numerals in FIGS. 7A and 7B denote members having common functions to those in the first embodiment.

A difference between the first and second embodiments is that, in the latter, a transmittance variable member 41 (partial light extraction means) having a plurality of linearly arranged electrochromic elements (to be referred to as ECDs hereinafter) serving as transmittance variable portions, a focusing lens 42, and a photoelectric transducer 43, which are arranged behind a light-receiving slit plate 23 to be adjacent to each other, are arranged in place of the photoelectric transducer 24 having the plurality of light-receiving portions.

With this arrangement, an image SL of a projection slit plate 13 projected by a projection objective lens 14 onto a detection surface 1 is re-focused on the light-receiving slit plate 23 by an imaging objective lens 21, and light transmitted through the transmittance variable member 41 is focused on the photoelectric transducer 43 by the focusing lens 42.

Figure 8A:
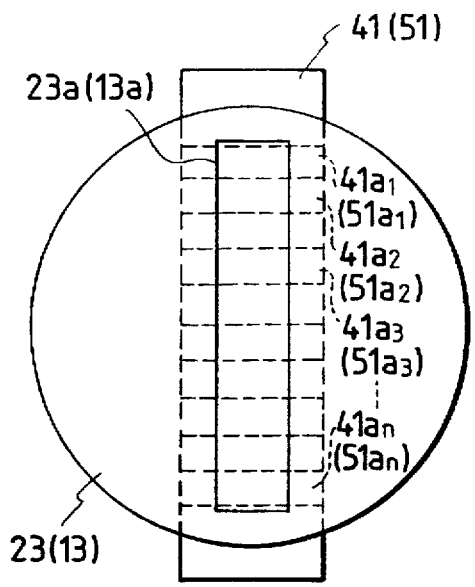
FIGS. 8A and 8B are views showing states of a transmittance variable member provided adjacent to a light-receiving slit plate in the second embodiment of the present invention or a projection slit plate in the third embodiment of the present invention.
Figure 8B:
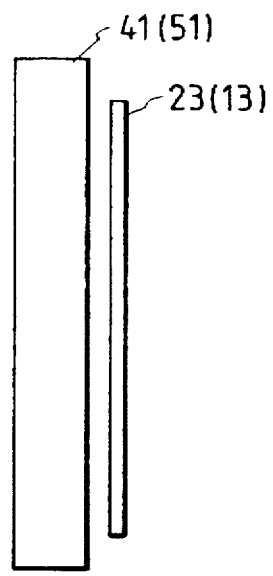

FIG. 8A is a plan view showing the light-receiving slit plate 23 and the transmittance variable member 41 arranged adjacent to the slit plate 23 on the side of a light source, and FIG. 8B is a side view of FIG. 8A. ECDs $41a_1$, $41a_2$, $41a_3$, ..., $41a_n$ of the transmittance variable member 41 are arranged in correspondence with portions $SLa_1$, $SLa_2$, $SLa_3$, ..., $SLa_n$ of slit light SL projected on the detection surface 1, and a projection slit image SL formed on the light-receiving slit plate 23. The transmittance variable member 41 is electrically controlled so as to be able to selectively decolor one ED to increase its transmittance, and to be able to color the remaining ECDs to have a transmittance of almost zero. For this reason, when the transmittance of only the ECD $41a_1$ is increased, only light reflected by the portion $SLa_1$ of the slit light SL projected on the detection surface can be received by the photoelectric transducer 43, and the position of the portion $SLa_1$ of the slit light SL projected on the detection surface can be detected.

Therefore, when a position where the transmittance of the ECD of the transmittance variable member 41 is to be increased is sequentially changed, the positions of the individual portions ($SLa_1$, $SLa_2$, $SLa_3$, ..., $SLa_n$) of the slit light SL projected on the detection surface 1 can be sequentially and selectively detected.

The second embodiment comprises an input means 28 and a selection means 29 in the same manner as in the first embodiment, and a selection signal selected by the selection means 29 is transmitted to the transmittance variable member 41. The transmittance variable member 41 selectively and sequentially changes the position, where the transmittance of the ECD in the transmittance variable member 41 is to be increased, on the basis of this selection signal, so that the light intensity distribution of reflected light at different positions on the detection surface, on which the slit light is projected, can be sequentially detected by the photoelectric transducer 43.

The sequentially detected output signals are subjected to signal processing by a synchronous detection method in a detection section 25 like in the first embodiment, and the positions at a plurality of selected points on the detection surface 1 can be detected.

In this embodiment, since the selection method of the selection means, and the arrangement and operation for correcting the detection surface to a correct position are the same as those in the first embodiment, a detailed description thereof will be omitted.

Weighting values may be set in accordance with the positions of points to be detected, and the transmittances of the ECDs ($41a_1$, $41a_2$, $41a_3$, ..., $41a_n$) may be changed in accordance with the weighting value, so that light reflected by the detection surface is detected by the photoelectric transducer 43 in a single detection. In this manner, the detection signal can be equal to one obtained by weighting and averaging signals at the respective detection points, and arithmetic operations can be omitted.

With the above arrangement, the second embodiment can also attain the same effects as that in the first embodiment.

The third embodiment of the present invention will be described below. FIGS. 9A and 9B show the schematic arrangement of the third embodiment, and the same reference numerals in FIGS. 9A and 9B denote members having common functions to those in the first embodiment.

A difference between the second and third embodiments is that, in the latter, a transmittance variable member 41 (partial light extraction means) having a plurality of ECDs ($41a_1$, $41a_2$, $41a_3$, ..., $41a_n$) is arranged at a position at the light source side adjacent to a projection slit plate 13, instead of at a position adjacent to a slit plate 23.

FIG. 9A is a plan view showing the projection slit plate 13, and a transmission variable member 51 arranged adjacent to the slit plate 13, and FIG. 9B is a side view of FIG. 9A.

ECDs $51a_1$, $51a_2$, $51a_3$, ..., $51a_n$ of the transmittance variable member 51 are arranged in correspondence with portions $SLa_1$, $SLa_2$, $SLa_3$, ..., $SLa_n$ of slit light SL projected on a detection surface. The member 51 is electrically controlled so as to be able to selectively decolor one ECD to increase its transmittance, and to be able to color the remaining ECDs to have a transmittance of almost zero. For this reason, when the transmittance of only the ECD $51a_1$ is increased, only the portion $SLa_1$ of the slit light SL to be projected onto the detection surface is projected on the detection surface 1, and only the corresponding reflected light component is received by a photoelectric transducer 43, thereby detecting the position of the portion $SLa_1$ of the slit light SL projected onto the detection surface 1.

Therefore, when a position where the transmittance of the ECD of the transmittance variable member 51 is changed is selectively and sequentially changed, the corresponding portion of the slit light SL to be projected onto the detection surface 1 is selectively projected onto the detection surface 1, so that the projected light components are sequentially projected onto different positions on the detection surface 1. When the reflected light components are sequentially detected, a plurality of positions on the detection surface on which light is selectively and sequentially projected can be detected.

In this embodiment, since the selection method of a selection means, and the arrangement and operation for correcting the detection surface to a correct position are the same as those in the first and second embodiments, a detailed description thereof will be omitted.

With the above arrangement, the third embodiment can also attain the same effects as that in the first and second embodiments.

In this manner, as has been described in the second or third embodiment, some of light components passing through the slit plate 13 or 23 arranged at a position conjugate with the detection surface 1 are caused to pass according to the position relative to the slit plate 13 or 23, so that the positions at a plurality of selected points on the detection surface 1 can be detected. Therefore, according to the present invention, liquid crystal elements may be used in place of the ECDs constituting the transmittance variable member. Furthermore, the same effect can be expected when light is mechanically shielded to extract some of light components passing through the slit plate 13 or 23. In this case, the following arrangement is preferable. That is a light-shielding member having a small rectangular or circular opening portion is arranged near the slit plate 13 or 23, and is vibrated in the longitudinal direction of the slit plate 13 or 23.

Note that a plurality of parallel slit-like opening portions may be formed in the projection slit plate 13, and a plurality of parallel slit-like opening portions of the light-receiving slit plate 23 and detectors may be parallelly arranged in correspondence with the opening portions of the slit plate 13. Thus, since light including position information at more points on the detection surface can be detected, position detection with higher accuracy can be attained.

A pattern having directivities in two orthogonal side directions of an exposure region 1a is often formed on a rectangular exposure region on a wafer as the detection surface 1. It is preferable to eliminate the influence of scattered light produced by this pattern for detection accuracy. For this purpose, as a preferable method of projecting a pattern image SL of the projection slit plate 13, the pattern image SL of the projection slit plate 13 is projected onto one diagonal of the rectangular exposure region. Furthermore, the optical axes of optical systems of two surface position detection apparatuses may be arranged to cross each other at the center of the detection surface, so that two projection slit images $SL_1$ and $SL_2$ can be projected on the two diagonals of the rectangular exposure region as the detection surface. Then, position detection at more measurement points on the entire two-dimensional detection surface can be realized. As a result, position detection with higher accuracy can be attained. More specifically, since the inclination of the exposure region on the wafer can be two-dimensionally measured, inclination correction (leveling) for causing the exposure region on the wafer to coincide with an image plane of the projection lens L can be performed, and the position detection accuracy on the entire exposure region on the wafer can be guaranteed.

Figure 10:
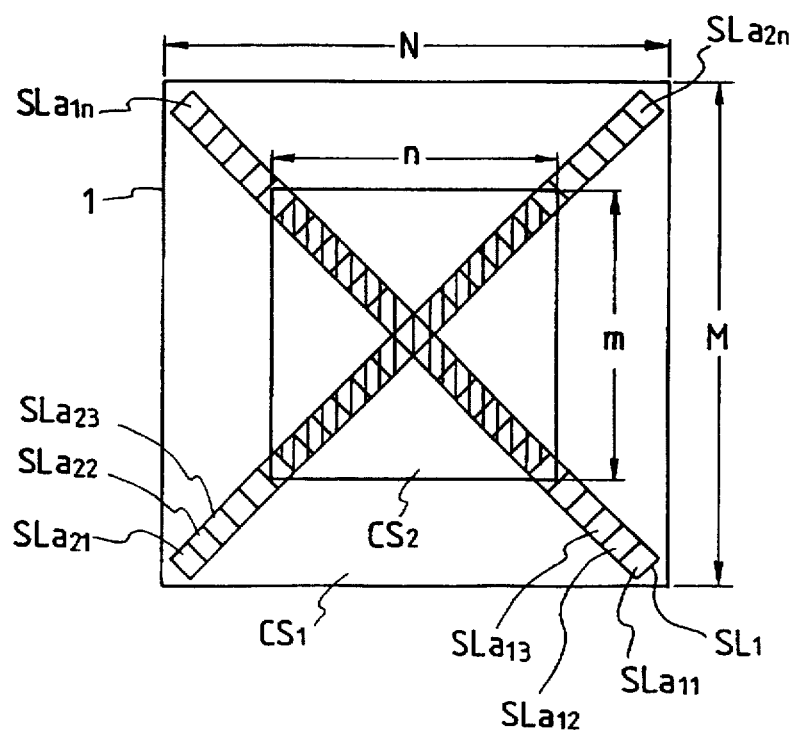
FIG. 10 is a view showing a position detection state when an LSI chip size is changed.

When exposure is performed for each chip on a wafer as the detection surface 1, even when the chip size (the size of an exposure region) is changed, multi-point position detection of the detection surface can be attained. For example, as shown in FIG. 10, two slit light beams $SL_1$ and $SL_2$ are projected onto the diagonals of a chip $CS_1$ having an M×N size, and multi-point position measurement along the diagonals of the chip $CS_1$ is performed. Even when an exposure operation of the M×N size chip $CS_1$ is switched to an exposure operation of an m×n size chip $CS_2$ smaller than the M×N size chip $CS_1$, portions indicated by hatching of the two slit light beams $LS_1$ and $SL_2$ can always cover the m×n size chip $CS_2$. Therefore, position measurement at a plurality of points on the m x n size chip $CS_2$ can be performed, thus attaining position detection with high accuracy. In this case, it is preferable that map data for chips having different sizes are input in advance to the input means, and the selection means instructs the detection section 25 to measure the positions of a plurality of proper positions within a reduced exposure region. Even when slit light is projected onto the detection surface in one direction, a change in chip size can be accommodated, as a matter of course.

Figure 11:
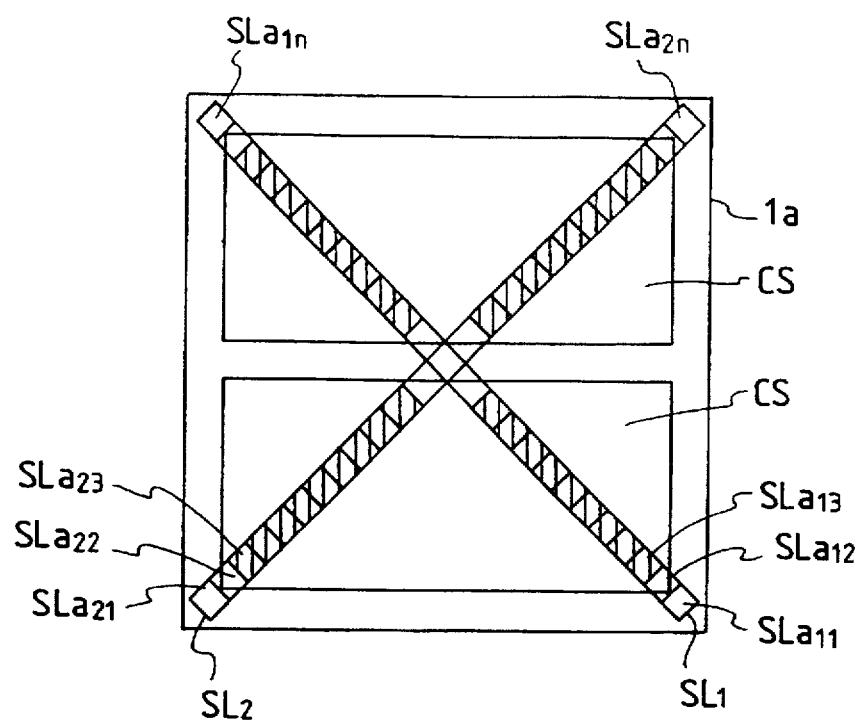
FIG. 11 is a view showing a position detection state when a plurality of LSI chips are simultaneously exposed.

Even when a plurality of chips are exposed on a wafer as the detection surface 1 at the same time, the present invention can attain position detection at a plurality of points on the detection surface. For example, as shown in FIG. 11, even when two chips CS are juxtaposed in a rectangular exposure region 1a as the detection surface, portions indicated by hatching of two slit light beams $SL_1$ and $SL_2$ projected onto the diagonals of the exposure region 1a can cover these two chips CS. Therefore, since position measurement on a plurality of points on the chips CS can be performed, accurate position detection can be attained. Even when slit light is projected onto the detection surface in one direction, the present invention can accommodate a case wherein a plurality of chips are exposed at the same time.

In order to eliminate the influence of thin film interference caused by a resist coated on a wafer as the detection surface, it is preferable that the light source 11 emits multi-wavelength light.

An example of a combination of the surface position detection apparatus according to the present invention described above, and a surface position detection apparatus for detecting average plane information of the entire detection surface (to be referred to as a surface inclination detection apparatus hereinafter) will be described hereinafter.

Figure 12:
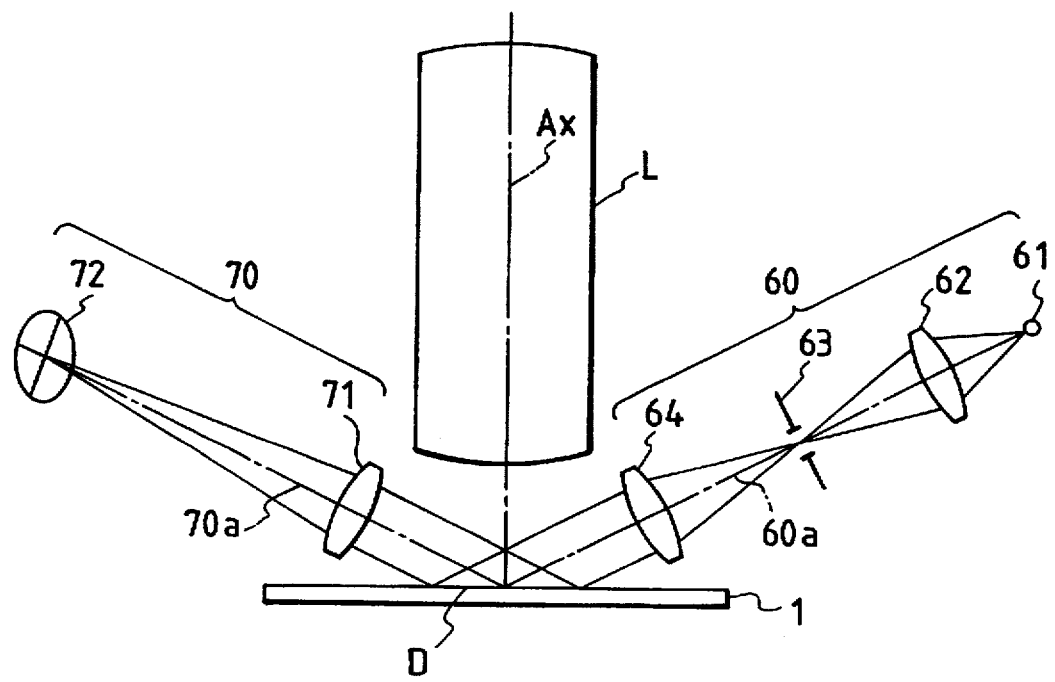
FIG. 12 is a view showing a surface position detection apparatus for detecting an average state of a detection surface.

The arrangement of the surface inclination detection apparatus for detecting average plane information of the overall detection surface will be described below with reference to FIG. 12. As shown in FIG. 12, an inclination detection projection optical system 60 comprises a light source 61, a condenser lens 62, a diaphragm 63 having a small circular opening portion, and a projection objective lens 64. The condenser lens 62 forms an image of the light source 61 on the diaphragm 63, and a parallel light beam is supplied onto a wafer as a detection surface 1 by the projection objective lens 64 having a focal point on the diaphragm 63.

An inclination detection imaging optical system 70 comprises an imaging objective lens 71, and a four-split light-receiving element 72. The parallel light beam supplied from the projection optical system 60 and reflected by the surface of the wafer 1 is formed by the imaging (or light-receiving) objective lens 71 on the four-split light-receiving element 72 arranged at the focal point position of the imaging objective lens 71.

An optical axis 60a of the projection optical system 60 is symmetrical with an optical axis 70a of the imaging optical system 70 with respect to an optical axis Ax of a projection lens L. Therefore, a light beam from the projection optical system 60 is imaged at the center of the four-split light-receiving element 72 as long as the exposure region of the wafer 1 is perpendicular to the optical axis Ax of the projection lens L. When the exposure region of the wafer 1 is inclined by θ from the perpendicular state, a parallel light beam from the projection optical system 60 and reflected by the wafer 1 is inclined by 2θ with respect to the optical axis 70a of the imaging optical system, and the light beam is focused at a position separated from the center on the four-split light-receiving element 72. In this manner, an average inclination amount of the exposure region of the wafer 1 can be detected on the basis of the position of the focused point on the four-split light-receiving element 72.

Figure 13:
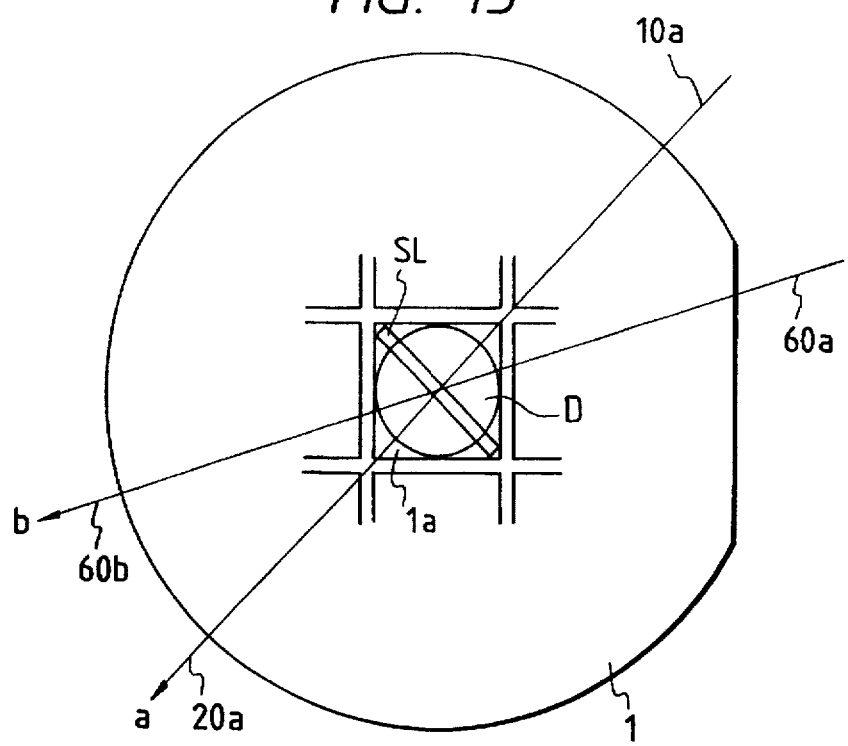
FIG. 13 is a view showing a state wherein a local position on the detection surface and an average position on the overall detection surface are detected.

FIG. 13 shows a state of the detection surface upon combination of the surface inclination detection apparatus shown in FIG. 12, and the surface position detection apparatus according to the present invention shown in FIGS. 1A, 1B, 7A, 7B, 9A, and 9B. The following description is made with reference to FIG. 13.

A projection slit image SL is projected by the surface position detection apparatus on one diagonal of an exposure region (one shot region) 1a on the wafer 1 as the detection surface, and a parallel light beam is radiated by the surface inclination detection apparatus on a circular region D inscribing (or circumscribing) the exposure region 1a on the wafer 1 from a direction different from the projection direction of the projection slit image SL. In this manner, the surface position detection apparatus can perform position detection at a plurality of points in one diagonal direction, and the surface inclination detection apparatus can detect an average inclination of the exposure region 1a. The surface state of the two-dimensional exposure region 1a can be detected with high accuracy.

Figure 14:
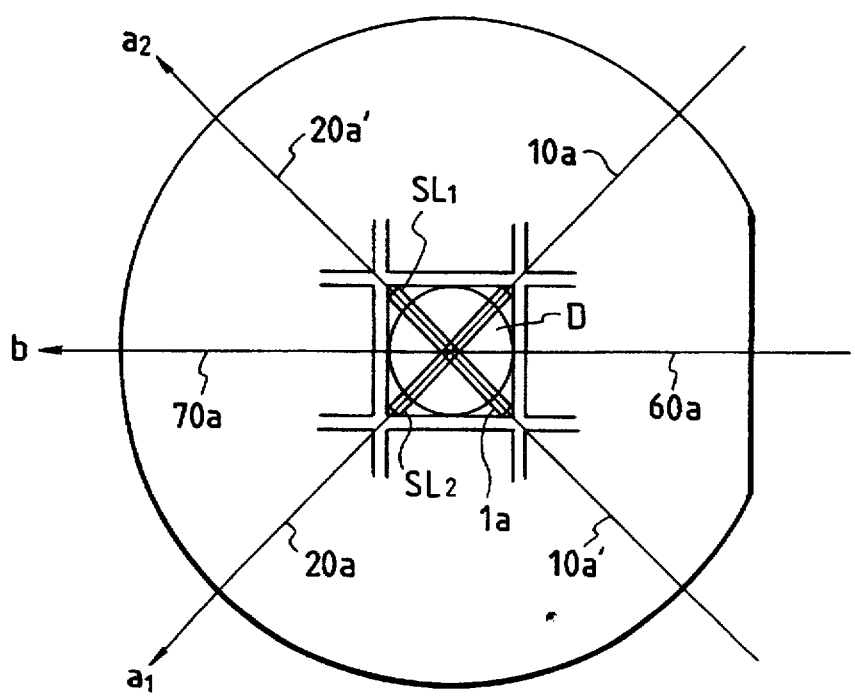
FIG. 14 is a view showing a modification of FIG. 13, which shows the state wherein a local position on the detection surface and an average position on the overall detection surface are detected.

Furthermore, as shown in FIG. 14, two surface position detection apparatuses may be arranged so as to be able to project projection slit images $SL_1$ and $SL_2$ onto two diagonals of the exposure region (one shot region) 1a on the wafer 1, and a parallel light beam may be radiated onto the circular region D inscribing (or circumscribing) the exposure region 1a on the wafer 1 from a direction different from the projection directions of these projection slit images $SL_1$ and $SL_2$. As a result, the surface state of the two-dimensional exposure region 1a can be detected with higher accuracy.

Figure 15:
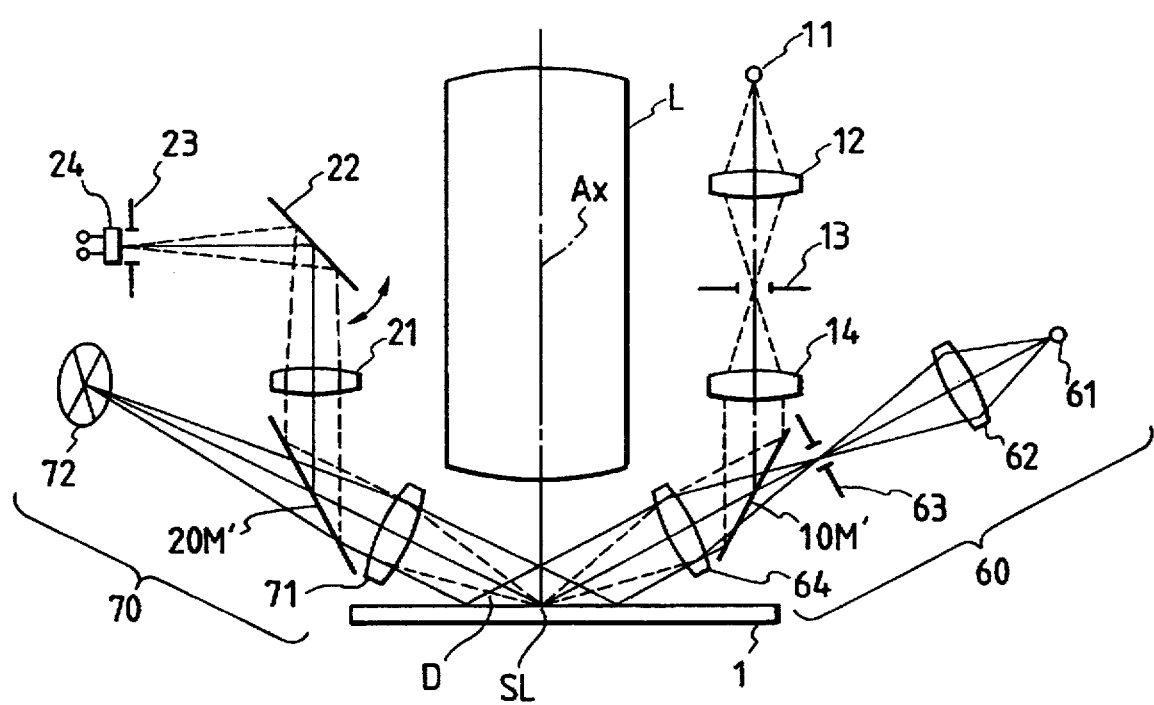
FIG. 15 is a view showing an arrangement of an apparatus obtained when the surface position detection apparatuses shown in FIGS. 1A and 1B and FIG. 12 are combined.

As shown in FIG. 15, the surface position detection apparatus and the surface inclination detection apparatus may be arranged using some common components so as to simplify the overall structure. In FIG. 15, the same reference numerals denote the same parts having the same functions as those in FIGS. 1A and 1B and FIG. 12.

More specifically, in the apparatus shown in FIG. 15, first and second dichroic mirrors 10M' and 20M' are respectively arranged in place of the first and second reflection mirrors 10M and 20M in the surface position detection apparatus shown in FIG. 1A, and projection objective lenses 14' and 64 and imaging objective lenses 71 and 21' are arranged with the two dichroic mirrors 10M' and 20M' therebetween. A light source 61, a condenser lens 62, and a diaphragm 63 of a projection optical system of the surface inclination detection apparatus are arranged in the transmission direction of the first dichroic mirror 10M', and a four-split light-receiving element 72 is arranged in the transmission direction of the second dichroic mirror 20M'.

With this arrangement, first wavelength light from a light source 11 propagates through a condenser lens 12, a projection slit plate 13, the projection objective lens 14', the first dichroic mirror 10M', and the projection objective lens 64, and an image SL of the projection slit plate 13 is projected onto an exposure region of a wafer 1. Thereafter, the light from the light source 11 reflected by the surface of the wafer 1 reaches a light-receiving element 24 through the imaging objective lens 71, the second dichroic mirror 20M', a vibration mirror 22, and a light-receiving slit plate 23, and position detection can be attained based on a plurality of output signals $SD_1$, $SD_2$, $SD_3$, ..., $SD_n$ from the light-receiving element 24.

On the other hand, light from the light source 61, which supplies second wavelength light different from the first wavelength light from the light source 11, is converted into a parallel light beam to be radiated onto a circular region D inscribing (circumscribing) the exposure region of the wafer 1 through the condenser lens 62, the diaphragm 63, the first dichroic mirror 10M', and the focusing objective lens 64. Thereafter, the parallel light beam reflected by the exposure region of the wafer 1 is focused on the four-split light-receiving element 72 through the imaging objective lens 71, and the second dichroic mirror 20M', and an average inclination of the overall exposure region of the wafer 1 can be detected according to an output signal from the four-split light-receiving element 72.

In this apparatus, the optical systems are arranged, so that their optical axes extend along one diagonal direction of the exposure region 1a of the wafer 1. Thus, inclination and multi-point position detection of the exposure region 1a can be attained, as shown in FIG. 13. Furthermore, when the surface position detection apparatus shown in FIG. 1 is arranged along the other diagonal direction of the exposure region 1a of the wafer 1, inclination and multi-point position detection of the exposure region 1a can be attained, as shown in FIG. 14.

In FIG. 15, the dichroic mirrors 10M' and 20M' are employed. However, these mirrors may be replaced with half mirrors. In this case, the light source 61 preferably supplies light having the same wavelength as that from the light source 11.

What is claimed is:

1. A surface position detection apparatus, comprising:

an optical system disposed to illuminate a detection surface with light and to receive the light from said detection surface;

a designation unit arranged to designate a plurality of different parts of said detection surface, in accordance with a stepped structure including high and low portions along a direction within an area on said detection surface that is illuminated by said optical system; and a detection unit arranged to detect, based on information of the light received by said optical system and information of said different parts of said detection surface designated by said designation unit, positions corresponding to said designated parts of said detection surface.

2. A surface position detection apparatus, comprising:

an optical system disposed to illuminate a detection surface with light and to receive the light from said detection surface;

a designation unit arranged to designate a plurality of different parts of said detection surface, in accordance with a structure including high reflectance and low reflectance portions within an area on said detection surface that is illuminated by said optical system; and a detection unit arranged to detect, based on information of the light received by said optical system and information of said different parts of said detection surface designated by said designation unit, positions corresponding to said designated parts of said detection surface.

3. A surface position detection apparatus, comprising:

an optical system disposed to illuminate a detection surface with light and to receive the light from said detection surface;

a designation unit arranged to designate a plurality of different parts of said detection surface, in accordance with a structure including coarse and dense patterns within an area on said detection surface that is illuminated by said optical system; and a detection unit arranged to detect, based on information of the light received by said optical system and information of said different parts of said detection surface designated by said designation unit, positions corresponding to said designated parts of said detection surface.

4. A surface position detection apparatus, comprising:

an optical system disposed to illuminate a detection surface with detection light and to receive detection light reflected by said detection surface;

a designation unit arranged to designate a plurality of different parts of said detection surface, in accordance with a structure within an area on said detection surface that is illuminated by said optical system, said structure including at least one of portions having variation in height along a direction, portions having variation in reflectance, and portions having variation in pattern density; and a detection unit disposed to detect, based on information of the light received by said optical system and information of said different parts of said detection surface designated by said designation unit, positions corresponding to said designated parts of said detection surface.

5. A method for detecting a surface position, comprising:

illuminating a detection surface of substrate with detection light;

receiving detection light reflected by said detection surface;

designating a plurality of different parts of said detection surface, in accordance with structure within an area on said detection surface that is illuminated with illumination light, said structure including at least one of portions having variation in height along a direction, portions having variation in reflectance, and portions having variation in pattern density; and detecting, based on information of the received light and information of said designated parts of said detection surface, positions corresponding to said designated parts of said detection surface.

6. A method for detecting a surface position, comprising:

illuminating a detection surface of a substrate with detection light;

receiving detection light reflected by said detection surface;

designating a plurality of different parts of said detection surface, in accordance with structure within an illuminated area on said detection surface, said structure including at least one of portions having variation in height along a direction, portions having variation in reflectance, and portions having variation in pattern density;

detecting, based on information of the received light and information of said designated parts of said detection surface, positions corresponding to said designated parts of said detection surface;

weighting the detected positions in accordance with said structure; and determining a position of said detection surface based on the weighted positions.

7. A method for detecting a surface position, comprising:

illuminating a detection surface of a substrate with detection light;

receiving detection light reflected by said detection surface;

designating a plurality of different parts of said detection surface, in accordance with a stepped structure including high and low portions along a direction within an illuminated area on said detection surface;

detecting, based on information of the received light and information of said designated parts of said detection surface, positions corresponding to said designated parts of said detection surface;

weighting the detected positions in accordance with a height difference of said stepped structure; and determining a position of said detection surface based on the weighted positions.

8. A method for detecting a surface position, comprising:

illuminating a detection surface of a substrate with detection light;

receiving detection light reflected by said detection surface;

designating a plurality of different parts of said detection surface, in accordance with a structure including high reflectance and low reflectance portions within an illuminated area on said detection surface;

detecting, based on information of the received light and information of said designated parts of said detection surface, positions corresponding to said designated parts of said detection surface;

weighting the detected positions in accordance with a reflectance difference of said structure; and determining a position of said detection surface based on the weighted positions.

9. A method for detecting a surface position, comprising:

illuminating a detection surface of a substrate with detection light;

receiving detection light reflected by said detection surface;

designating a plurality of different parts of said detection surface, in accordance with a structure including coarse and dense patterns within an illuminated area on said detection surface;

detecting, based on information of the received light and information of said designated parts of said detection surface, positions corresponding to said designated parts of said detection surface;

weighting the detected positions in accordance with a pattern density difference of said structure; and determining a position of said detection surface based on the weighted positions.

10. A surface position detection apparatus, comprising:

a detection optical system which illuminates a detection surface with light and receives light from said detection surface;

a designation unit which designates a plurality of detection points on said detection surface, in accordance with a stepped structure including high and low portions within an area on said detection surface that is illuminated by said detection optical system; and a detection unit which photoelectrically converts portions of light corresponding to said plurality of detection points received by said detection optical system, and which detects positions related to said plurality of detection points on said detection surface, based on information obtained by the photoelectric conversion.

11. A surface detection apparatus, comprising:

a detection optical system which illuminates a detection surface with light and receives light from said detection surface;

a designation unit which designates a plurality of detection points on said detection surface, in accordance with a structure including high reflectance and low reflectance portions within an area on said detection surface that is illuminated by said detection optical system; and a detection unit which photoelectrically converts portions of light corresponding to said plurality of detection points received by said detection optical system, and which detects positions related to said plurality of detection points on said detection surface, based on information obtained by the photoelectric conversion.

12. A surface detection apparatus, comprising:

a detection optical system which illuminates a detection surface with light and receives light from said detection surface;

a designation unit which designates a plurality of detection points on said detection surface, in accordance with a structure including coarse and dense patterns within an area on said detection surface that is illuminated by said detection optical system; and a detection unit which photoelectrically converts portions of light corresponding to said plurality of detection points received by said detection optical system, and which detects positions related to said plurality of detection points on said detection surface, based on information obtained by the photoelectric conversion.

13. A surface detection apparatus, comprising:

a detection optical system which illuminates a detection surface with light and receives light from said detection surface;

a designation unit which designates a plurality of detection points on said detection surface, in accordance with a structure within an area on said detection surface that is illuminated by said detection optical system, said structure including at least one of portions having variation in height, portions having variation in reflectance, and portions having variation in pattern density; and a detection unit which photoelectrically converts portions of light corresponding to said plurality of detection points received by said detection optical system, and which detects positions related to said plurality of detection points on said detection surface, based on information obtained by the photoelectric conversion.

14. A method for detecting a surface position, comprising:

illuminating a detection surface;

receiving light from said detection surface;

designating a plurality of different parts of said detection surface as detection points, in accordance with a structure within an illuminated area on said detection surface, said structure including at least one of portions having variation in height, portions having variation in reflectance, and portions having variation in pattern density; and photoelectrically converting portions of light corresponding to said plurality of detection points so as to detect positions related to said plurality of detection points on said detection surface, based on information obtained by the photoelectric conversion.

15. A method for detecting a surface position, comprising:

illuminating a detection surface;

receiving light from said detection surface;

designating a plurality of different parts of said detection surface as detection points, in accordance with a structure within an illuminated area on said detection surface, said structure including at least one of portions having variation in height, portions having variation in reflectance, and portions having variation in pattern density;

photoelectrically converting portions of light corresponding to said plurality of detection points so as to detect positions related to said plurality of detection points on said detection surface, based on information obtained by the photoelectric conversion;

weighting the detected positions in accordance with said structure; and determining a position of said detection surface based on the weighted positions.

16. An exposure apparatus, comprising:

a stage on which a substrate is placed;

a projection optical system which forms an exposure area on said substrate;

a detection optical system which illuminates said exposure area formed by said projection optical system and receives light from said exposure area;

a designation unit which designates a plurality of different portions on said detection surface as detection points, in accordance with a structure within an area on said exposure area that is illuminated by said detection optical system, said structure including at least one of portions having variation in height, portions having variation in reflectance, and portions having variation in pattern density;

a detection unit which photoelectrically converts portions of light corresponding to said plurality of detection points received by said detection optical system, and which detects positions related to said plurality of detection points on said detection surface, based on information obtained by the photoelectric conversion; and a correction unit which corrects a position of said substrate based on detection information from said detection unit.

17. A method of manufacturing a semiconductor device utilizing an exposure apparatus as claimed in claim 16, and comprising transferring a predetermined pattern onto the exposure area on said substrate through said projection optical system.

18. An exposure apparatus, comprising:

a stage on which a substrate is placed;

a projection optical system which forms an exposure area on said substrate;

a detection optical system which illuminates said exposure area formed by said projection optical system and receives light from said exposure area;

a detection system which designates a plurality of different portions on said detection surface as detection points, in accordance with a structure within an area on said exposure area that is illuminated by said detection optical system, and which detects positions related to the plurality of detection points within said exposure area, based on information on light received by said detection optical system, said structure including at least one of portions having variation in height, portions having variation in reflectance, and portions having variation in pattern density; and a correction unit which corrects a position of said substrate based on detection information from said detection system.

19. A method of manufacturing a semiconductor device utilizing an apparatus as claimed in claim 18, and comprising transferring a predetermined pattern onto the exposure area on said substrate through said projection optical system.

* * * * *